United States Patent [19]
Yamamoto

[11] Patent Number: 5,331,323
[45] Date of Patent: Jul. 19, 1994

[54] ANALOG-TO-DIGITAL CONNECTER USING MULTI-GATE FIELD EFFECT TRANSISTORS

[75] Inventor: Makoto Yamamoto, Tokyo, Japan

[73] Assignee: Yozan Inc., Tokyo, Japan

[21] Appl. No.: 57,782

[22] Filed: May 6, 1993

[30] Foreign Application Priority Data
May 11, 1992 [JP] Japan .................... 4-144783

[51] Int. Cl.$^5$ .......................... H03M 1/12
[52] U.S. Cl. ...................... 341/136; 341/155
[58] Field of Search .......... 341/136, 118, 155, 158, 341/159

[56] References Cited
U.S. PATENT DOCUMENTS 4,547,763 10/1985 Flamm ........................ 341/118
5,117,235 5/1992 Ho-sun ....................... 341/159

OTHER PUBLICATIONS
Souda, Yasushi, "The CMOS Device Manual", CQ Shuppan Kabushiki Kaisha, 1991, pp. 252-253.

Primary Examiner—Brian K. Young
Attorney, Agent, or Firm—Cushman, Darby & Cushman

[57] ABSTRACT

The present invention is directed to an analog-to-digital (A/D) converter realized by a small circuit. The A/D converter according to this invention generates a discrete output voltage having several levels in response to an input analog voltage. It includes a number of field effect transistors (FETs), each of which corresponds to an output voltage level and has multiple gates for receiving outputs of higher-order FETs, the input voltage and a negative offset voltage. The A/D converter also includes a voltage divider for generating the offset voltage for each FET and a plurality of inverters corresponding to each FET for outputting a constant positive voltage in response to a negative output of the corresponding FET and for outputting a zero voltage responsive to a positive output of the corresponding FET.

10 Claims, 4 Drawing Sheets

ANALOG-TO-DIGITAL CONNECTER USING MULTI-GATE FIELD EFFECT TRANSISTORS

FIELD OF THE INVENTION

The present invention relates to an analog-to-digital (A/D) converter for converting an analog signal into a digital signal with predetermined descrete levels.

BACKGROUND OF THE INVENTION

As shown in FIG. 5, conventionally and generally, an A/D converter distributes an input voltage Vin by voltage divider DV1, compares the distributed voltage with an offset voltage using comparator array C, and converts the result of comparison into a digital signal having a predetermined bit width using encoder ED to provide an output D. The offset voltage is generated by reference voltage generating means, such as DV0.

In this way the conventional A/D converter has a rather large circuit and consumes a relatively large amount of electric power.

SUMMARY OF THE INVENTION

The present invention solves the above problems and has an object to provide an A/D converter realized by a small size circuit.

An A/D converter according to the present invention uses field effect transistor (FETs)) comprising plural gates as inverse logic. Inverting each output, a digital value can be obtained.

PREFERRED EMBODIMENT OF THE PRESENT INVENTION

Hereinafter an embodiment according to the present invention is described with reference to the attached drawings.

Figure 1:
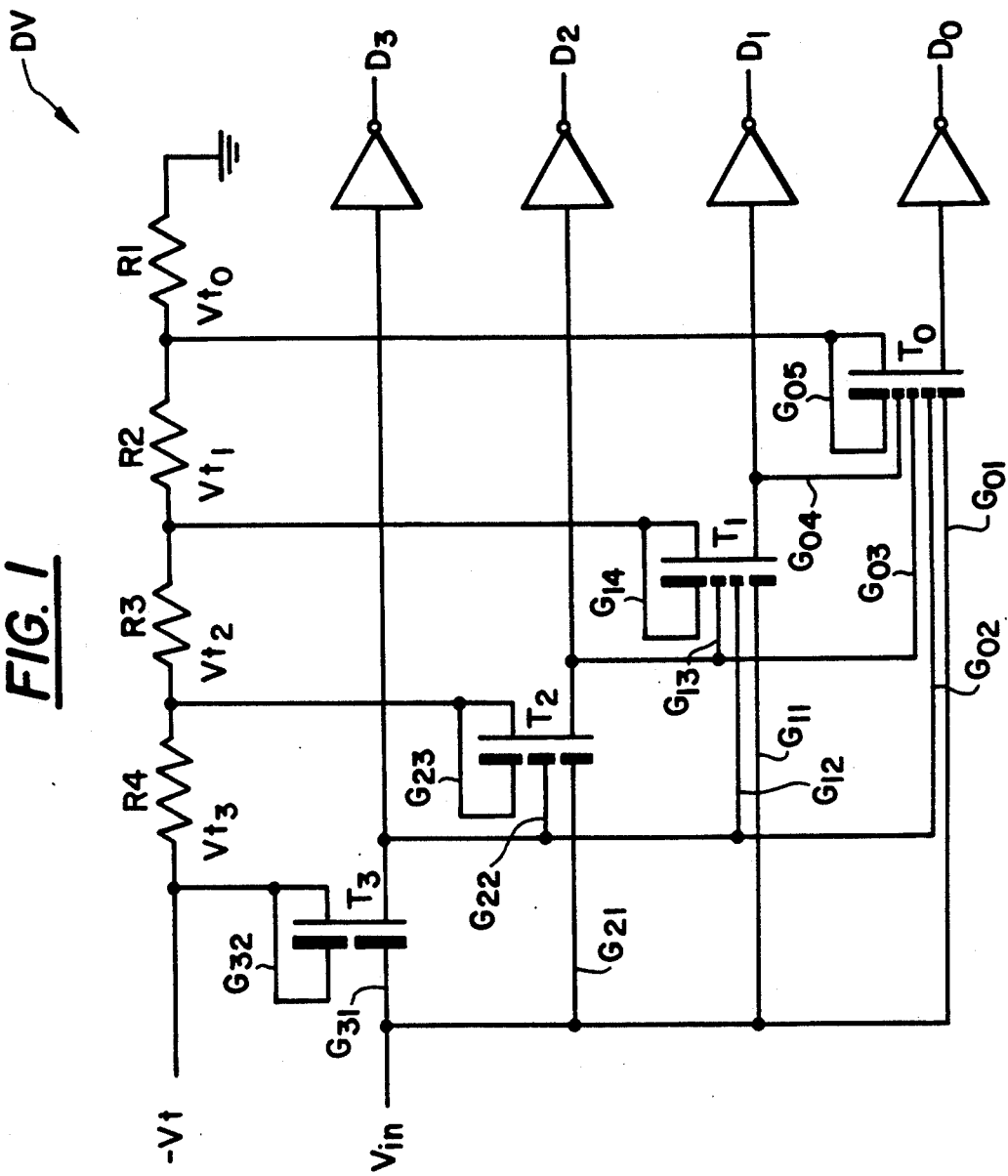
FIG. 1 shows a circuit of an embodiment of the A/D converter according to the present invention.

FIG. 1 shows an A/D converter an for converting input voltage Vin into a digital value of 4 bits. The A/D converter consists of FETs from T0 to T3 each of which has a plural number of gates. These FETs each correspond to a digit place of the digital value: T0, T1, T2 and T3 correspond to the LSB, the second digit, the third digit and MSB, respectively.

The input voltage Vin is input to G01, G11, G21 and G31 each of which are one of the gatesof an FET. The output of each FET is inverted in an inverting step circuit by inverting IV0 to IV3 and the output for each digit place D0 to D3 are generated.

The output of the FET corresponding to the upper digit place is input to a gate of each of FETs T0 to T3, simultaneously and, offset voltage Vt0 to Vt3 generated in the voltage divider DV are input as well. The offset voltage determines the upper limit of the digit place corresponding to each FET. Each FET outputs the inverted value of the digit place according to the input voltage Vin, the output of the upper FETs and the offset voltage from voltage divider DV. FET has the characteristic of addition with respect to the gate voltage and becomes conductive when the summation of the gate voltage is equal to or greater than the offset voltage from DV (it is 0V in the description below), and then the impressive voltage of drain is generated in the source.

Figure 2:
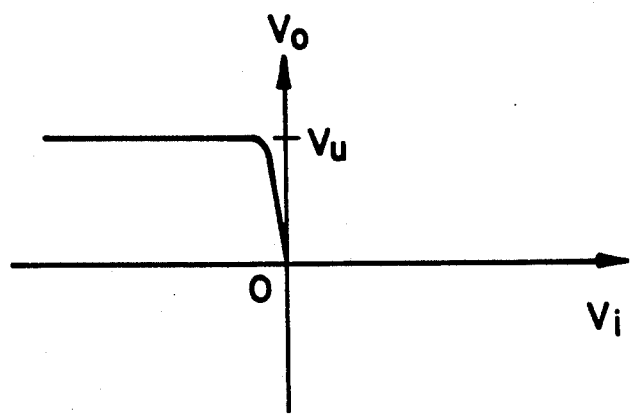
FIG. 2 shows a graph curve of the characteristic of inverting step circuit shown in FIG. 1.

The output of each FET is input to inverting step circuits from IV0 to IV3, and the output of each digit place can be obtained according to the characteristic in FIG. 2. In an inverting step circuit, the output "v0" is 0 for any plus input "vi" and the voltage "vu" is generated for a minus input corresponding to a digital "1". The offset voltage from Vt0 to Vt3 are determined as below.

$$Vt0 = -vu \times 2^0$$

$$Vt1 = -vu \times 2^1$$

$$Vt2 = -vu \times 2^2$$

$$Vt3 = -vu \times 2^3$$

Figure 4:
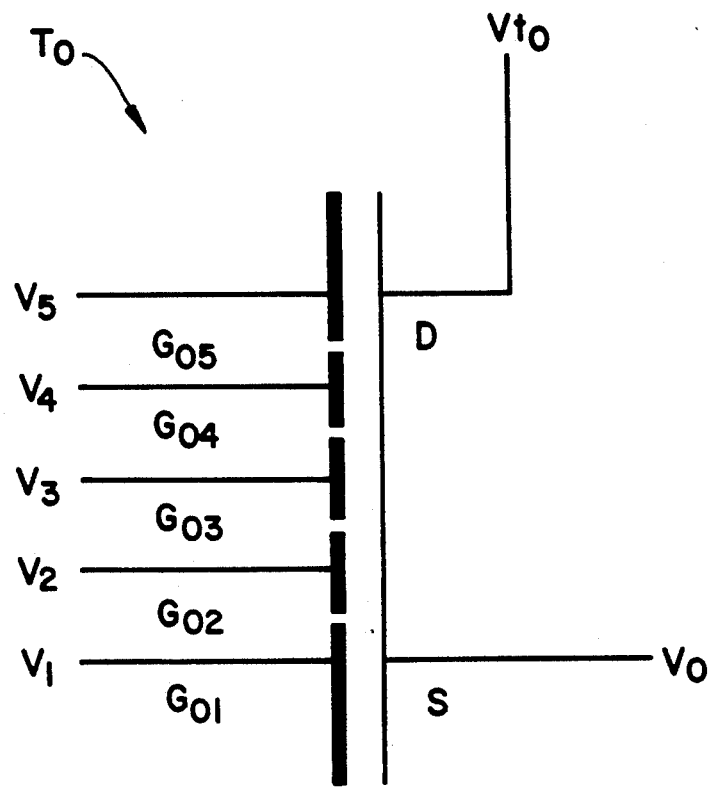
FIG. 4 shows a concept of an FET in the embodiment.
Figure 5:
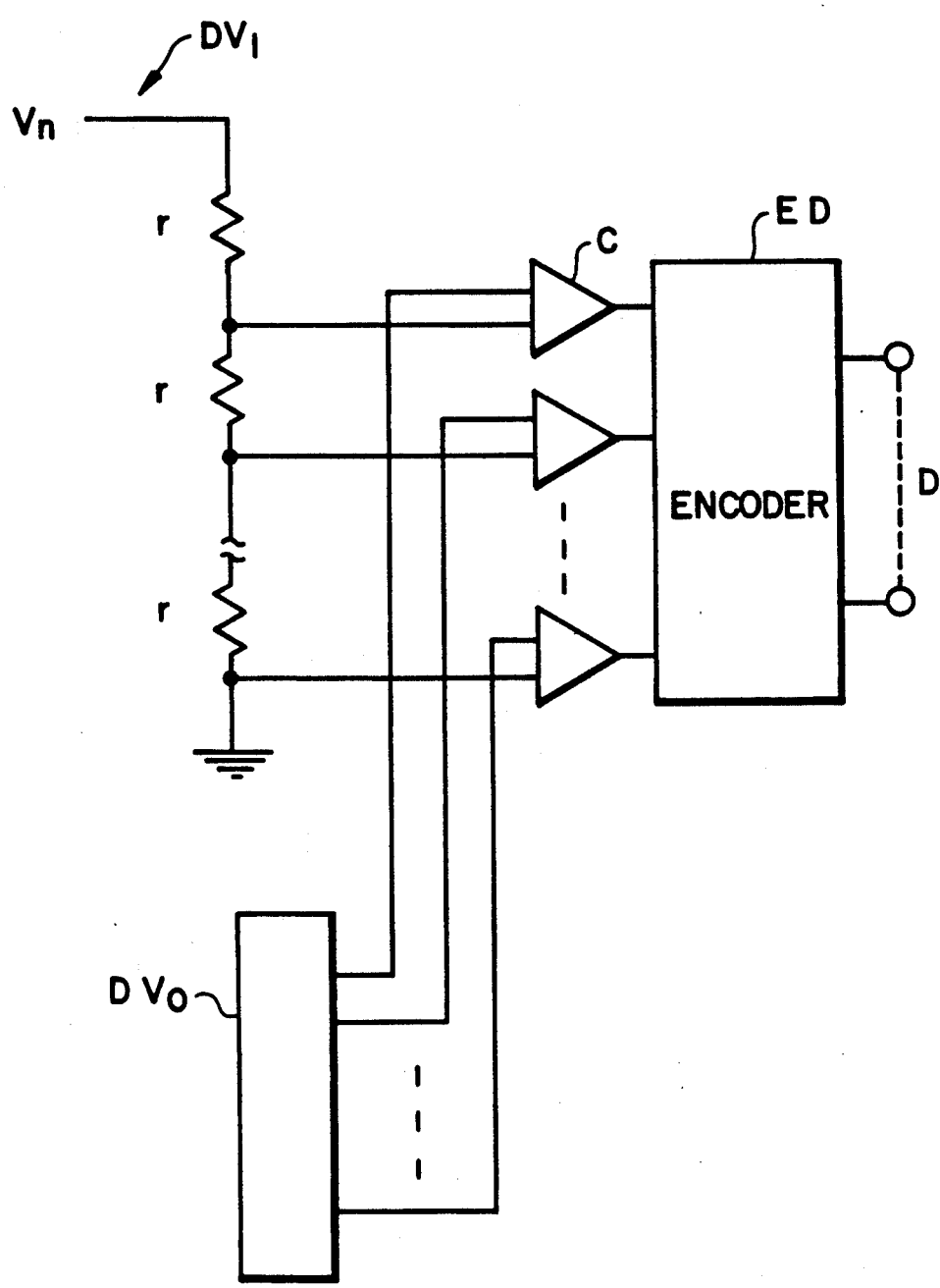
FIG. 5 shows a circuit of a conventional A/D converter.

The action of the FET is described using as an example FET "T0" of LSB in FIG. 4.

FET "T0" comprises five gates G01, G02, G03, G04 and G05. Offset voltage Vt0 is impressed on drain D. As shown below, each gate receives an input.

Gate G01: Input voltage Vin
Gate G02: Output of FET T3
Gate G03: Output of FET T2
Gate G04: Output of FET T1
Gate G05: Offset voltage Vt0

Representing the voltage to be impressed to gates from G01 to G05 by V1 to V5, respectively, and the step function by S( ), a function can be obtained as below.

$$V0 = Vt0 \times S\left( \sum_{k}^{5} Vk \right) \qquad (1)$$

The formula in (1) can be varied as below.

$$V0 = Vt0 \times S(Vt0 + V2 + V3 + V4 + Vin) \qquad (2)$$

$$= Vt0 \times S \{Vt0 + (\text{an output of } FET\ T3) + \qquad (3)$$
$$(\text{an output of } FET\ T2) +$$
$$(\text{an output of } FET\ T1) + Vin\}$$

For example when Vin is $10 \times vu$, FET T3 is conductive and Vt3 ($=8 \times vu$) is input to the gate of FET T2. Then, (Vin+Vt2+Vt3), which is equal to (10−4−8) vu, which is equal to −2 vu is input to the gate of FET T2: but FET T2 does not become conductive because the input is not positive value. The gate voltage below is provided to FETs T1 and T0.

T1: (Vin+Vt1+Vt3)=(10−2−8)vu=0V
T0: (Vin+Vt1+Vt0+Vt3)=(10−2−1−8)vu=-vu

T1 and T3 become conductive and T0 and T2 does not become conductive. Only IV1 and IV3 receive a minus voltage which is converted into "1" by an inverting step function. As the result, D0 and D2 are 0 and D1 and D3 are 1. That means a digital output "1010" is generated.

Figure 3:
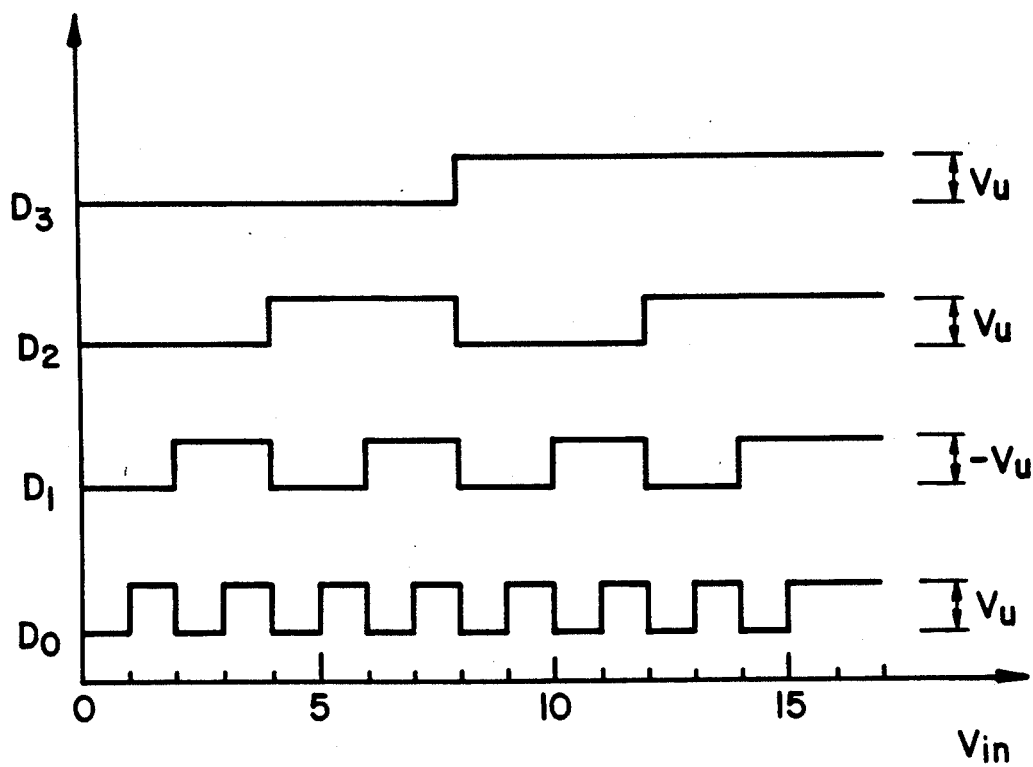
FIG. 3 shows a graph of the digital output in the embodiment.

The change from D0 to D3 corresponding to the change of input Vin is shown in FIG. 3.

A digital value of 1 bit can be generated by one (1) FET and one (1) inverting step circuit. The size of it is much smaller than the conventional circuit which needs a comparator, an encoder and a resistance. It is easy to realize it by LSI.

As mentioned, it is possible to realize an A/D converter by a small circuit because the A/D converter according to the present invention uses a FET comprising plural gates as the inverted logic of each digit place of digital value, and obtains a digital value by inverting each output.

What is claimed is:

1. An analog-to-digital converter for generating a digital output in response to an analog input voltage, said converter comprising:
    a plurality of FETs each of which corresponds to a bit of said digital output, each FET having a plurality of gates for receiving outputs of FETs corresponding to more significant bits of said digital output, said analog input voltage and an offset voltage of a first polarity;
    a voltage divider for generating said offset voltage; and
    a plurality of inverters, each of which corresponds to an FET, for outputting a constant voltage having a second polarity opposite said first polarity in response to an output of said first polarity of said corresponding FET and for outputting a zero voltage in response to an output of said second polarity of said corresponding FET.

2. The converter of claim 1, wherein said first polarity is a negative polarity, and said second polarity is a positive polarity.

3. An analog-to-digital converter for generating a digital output in response to an analog input voltage, said converter comprising:
    a voltage divider providing a plurality of offset voltages;
    a plurality of conversion means, each of said conversion means corresponding to an output bit of said digital output and receiving as inputs said analog input signal, one of said plurality of offset voltages, and first outputs of any of said plurality of conversion means corresponding to higher-order bits of said digital output;
    wherein each of said plurality of conversion means is for providing an output representative of its corresponding bit of said digital output.

4. The converter of claim 3, each of said conversion means comprising:
    an FET having said analog signal, said one of said plurality of offset voltages, and said first outputs each as an input to a gate of said FET.

5. The converter of claim 4, wherein each of said FETs has a drain receiving said corresponding offset voltage and a source providing said first output.

6. The converter of claim 3, said conversion means comprising:
    comparison means receiving as inputs said analog input signal, said one of said plurality of offset voltages, and said first outputs of any of said plurality of conversion means corresponding to higher-order bits of said digital output, and providing as said first output said one of said plurality of offset voltages when a sum of inputs of said comparison means is positive; and
    inverter means receiving said first output for providing as said second output a binary-valued signal having a "1" value when said first output is said one of said plurality of offset voltages and "0" otherwise.

7. The converter of claim 6, each of said comparison means comprising:
    an FET receiving as inputs said analog input signal, said one of said plurality of offset voltages, and said first outputs of any of said plurality of conversion means corresponding to higher-order bits of said digital output.

8. The converter of claim 3, said voltage divider comprising a binary-weighted resistor ladder.

9. The converter of claim 3, wherein said analog input signal and said second outputs are opposite in polarity to said plurality of offset voltages and said first outputs.

10. The converter of claim 9, wherein said analog input signal and said second outputs are positive and said plurality of offset voltages and said first outputs are negative.

* * * * *